United States Patent
Hata et al.

(10) Patent No.: US 9,557,020 B2
(45) Date of Patent: Jan. 31, 2017

(54) COLUMNAR LIGHT EMITTING DEVICE AND MANUFACTURING METHOD OF THE SAME

(71) Applicant: SHARP KABUSHIKI KAISHA, Osaka-shi, Osaka (JP)

(72) Inventors: Toshio Hata, Osaka (JP); Yuhsuke Fujita, Osaka (JP); Kenichi Akamatsu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/415,001

(22) PCT Filed: Jun. 6, 2013

(86) PCT No.: PCT/JP2013/003551
§ 371 (c)(1),
(2) Date: Jan. 15, 2015

(87) PCT Pub. No.: WO2014/013665
PCT Pub. Date: Jan. 23, 2014

(65) Prior Publication Data
US 2015/0176783 A1    Jun. 25, 2015

(30) Foreign Application Priority Data

Jul. 19, 2012  (JP) ................................ 2012-160686

(51) Int. Cl.
*F21S 4/00* (2016.01)
*H01L 25/075* (2006.01)
(Continued)

(52) U.S. Cl.
CPC .................. *F21S 4/005* (2013.01); *F21K 9/90* (2013.01); *F21S 4/22* (2016.01); *F21V 23/002* (2013.01);
(Continued)

(58) Field of Classification Search
CPC .................. H01L 2224/73265; H01L 2224/97; H01L 25/0753; H01L 33/56; H01L 2224/32188; H01L 2224/32245; H01L 2224/49113; H01L 33/62; H01L 21/4846; H01L 2224/29082; H01L 2924/12041; F21Y 2101/02; F21Y 2103/003; F21Y 2101/00; F21Y 2115/10; F21S 4/006; F21S 4/003; F21S 4/005; F21S 2/005; F21S 4/20; F21S 4/22; F21K 9/00; F21K 9/20; G02B 6/0068; G02B 6/0073; G02B 6/009; H05K 1/189; H05K 2201/10106; H05K 1/0278; H05K 2201/09036; H05K 2201/09063; H05K 2201/09127; H05K 1/0393; H05K 1/147; H05K 1/118; Y10T 29/49146
See application file for complete search history.

(56) References Cited

U.S. PATENT DOCUMENTS 4,681,654 A * 7/1987 Clementi ............ H01L 21/4846
156/253
4,761,720 A * 8/1988 Solow ..................... F21S 4/006
362/235
(Continued)

FOREIGN PATENT DOCUMENTS

JP   63-213301    9/1988
JP   08-046242 A  2/1996
(Continued)

OTHER PUBLICATIONS

Japanese Office Action and partial English translation mailed Jul. 21, 2015 in Japanese Patent Application 2014-525695.

Primary Examiner — Hargobing S Sawhney
(74) Attorney, Agent, or Firm — Nixon & Vanderhye P.C.

(57) ABSTRACT

The device bends readily and safely without a sealing resin peeling off or a breakage in a wire.

(Continued)

In an LED columnar light emitting device 1 in which a plurality of two conductive regions 2 and 3 corresponding to the ± polarities are provided in the columnar direction on a film wiring board, each light emitting element is connected to and installed on the plurality of two conductive regions 2 and 3, and each LED chip 6, as each light emitting element, is sealed above with a transparent sealing resin 8, notch sections 9 and 9A are formed on both outer sides of two plated lines 4 as opening sections between the two conductive regions 2 and 3 and another two conductive regions 2 and 3 adjacent thereto in the columnar direction.

2 Claims, 10 Drawing Sheets

(51) Int. Cl.
| | | |
|---|---|---|
| *H01L 23/00* | (2006.01) | |
| *H05K 1/02* | (2006.01) | |
| *F21K 99/00* | (2016.01) | |
| *F21V 23/00* | (2015.01) | |
| *H01L 33/56* | (2010.01) | |
| *H01L 33/62* | (2010.01) | |
| *H05K 3/00* | (2006.01) | |
| *H01L 33/54* | (2010.01) | |

(52) U.S. Cl.
CPC ......... *H01L 24/97* (2013.01); *H01L 25/0753* (2013.01); *H01L 33/56* (2013.01); *H05K 1/0278* (2013.01); *H01L 24/45* (2013.01); *H01L 33/54* (2013.01); *H01L 33/62* (2013.01); *H01L 2224/45144* (2013.01); *H01L 2224/48091* (2013.01); *H01L 2224/48227* (2013.01); *H01L 2924/12042* (2013.01); *H01L 2924/181* (2013.01); *H05K 3/0052* (2013.01); *H05K 2201/09063* (2013.01); *H05K 2201/10106* (2013.01); *Y10T 29/49146* (2015.01)

(56) References Cited

U.S. PATENT DOCUMENTS

| | | | | |
|---|---|---|---|---|
| 6,866,394 | B1* | 3/2005 | Hutchins | E01F 9/007 362/192 |
| 7,690,817 | B2* | 4/2010 | Sanpei | H05K 1/0203 362/249.02 |
| 8,388,182 | B2* | 3/2013 | Chang | F21S 4/006 362/249.02 |
| 8,963,012 | B2* | 2/2015 | Uehara | H05K 1/056 174/254 |
| 8,967,827 | B2* | 3/2015 | Urano | F21K 9/17 362/249.02 |
| 2004/0183958 | A1* | 9/2004 | Akiyama | G09F 9/30 349/58 |
| 2005/0092517 | A1* | 5/2005 | Fan | F21S 4/006 174/117 FF |
| 2012/0002420 | A1 | 1/2012 | Imai et al. | |

FOREIGN PATENT DOCUMENTS

| | | |
|---|---|---|
| JP | 11-026813 A | 1/1999 |
| JP | 2003-023221 | 1/2003 |
| JP | 2004-103993 | 4/2004 |
| JP | 2004-200537 | 7/2004 |
| JP | 2007-258318 | 10/2007 |
| JP | 2007-317981 | 12/2007 |
| JP | 2009-081195 A | 4/2009 |
| JP | 2012-033855 | 2/2012 |
| WO | WO 2012/011363 | 1/2012 |

* cited by examiner

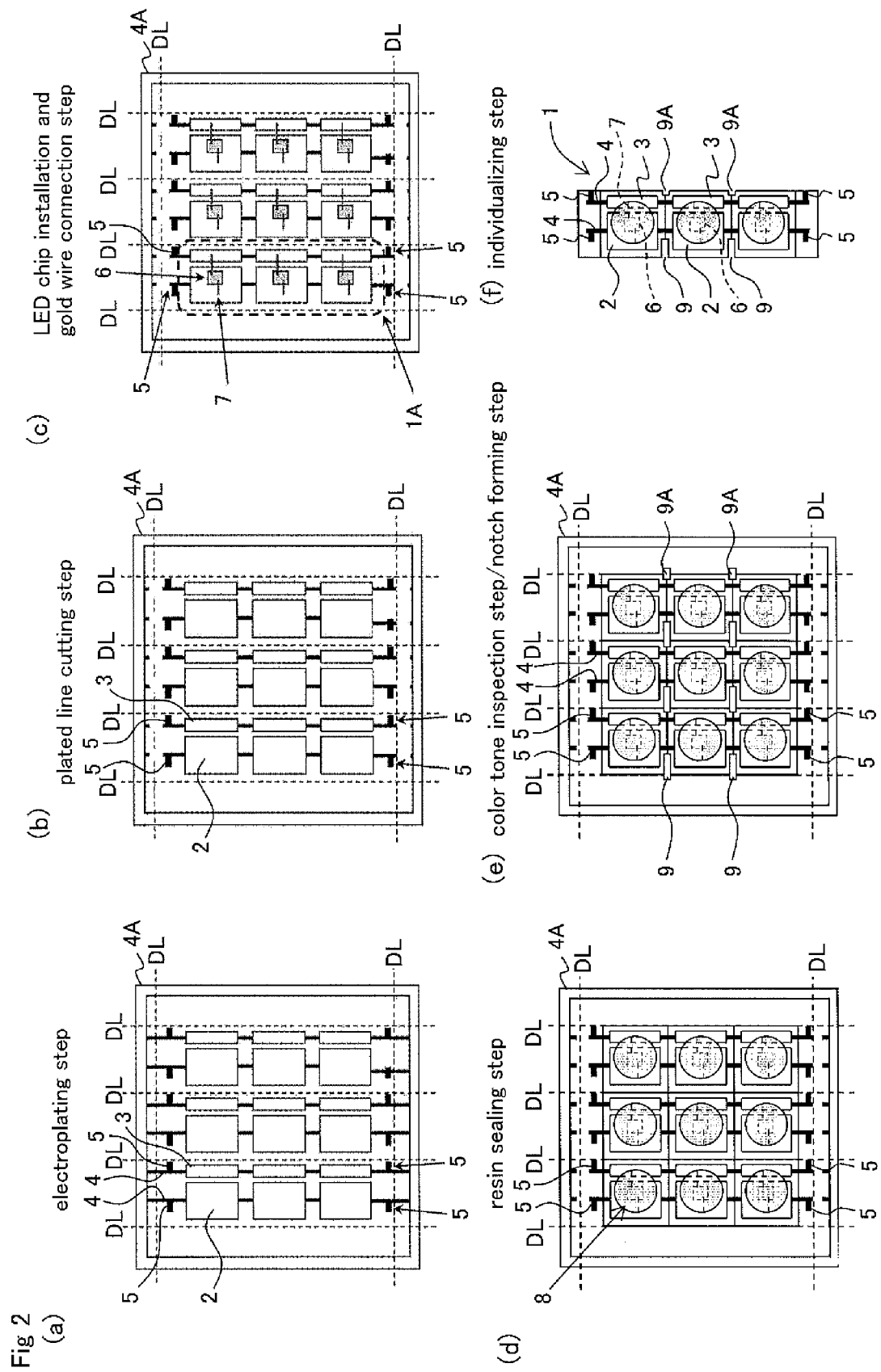

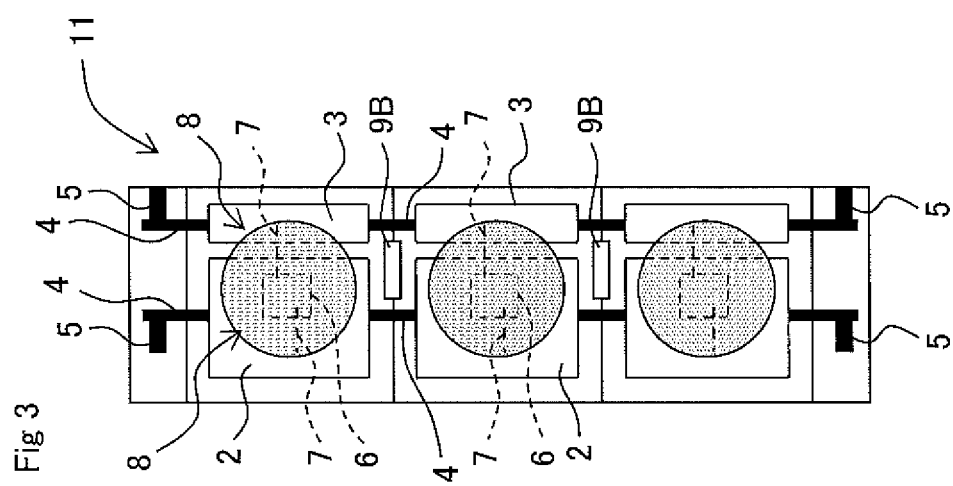

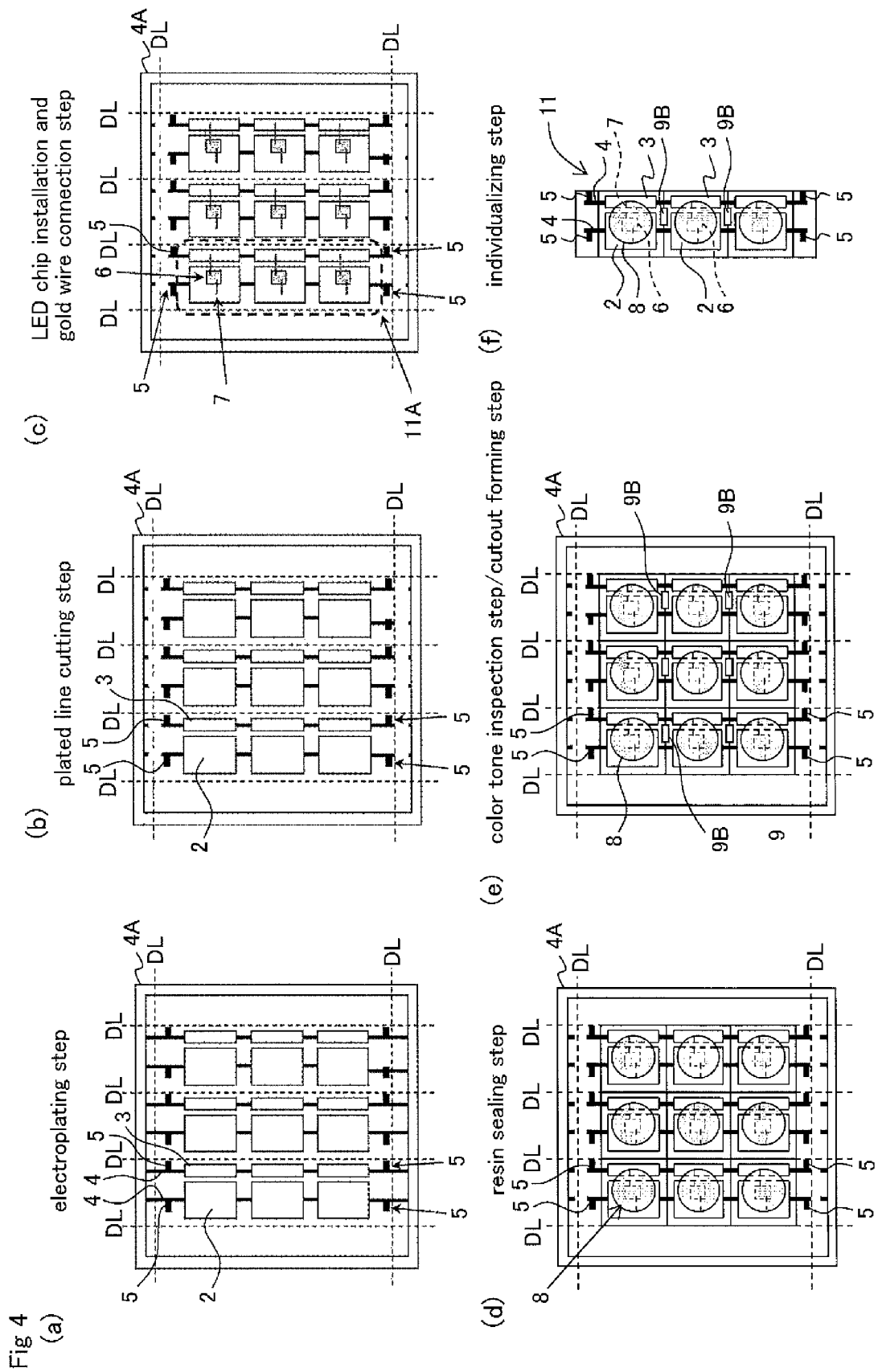

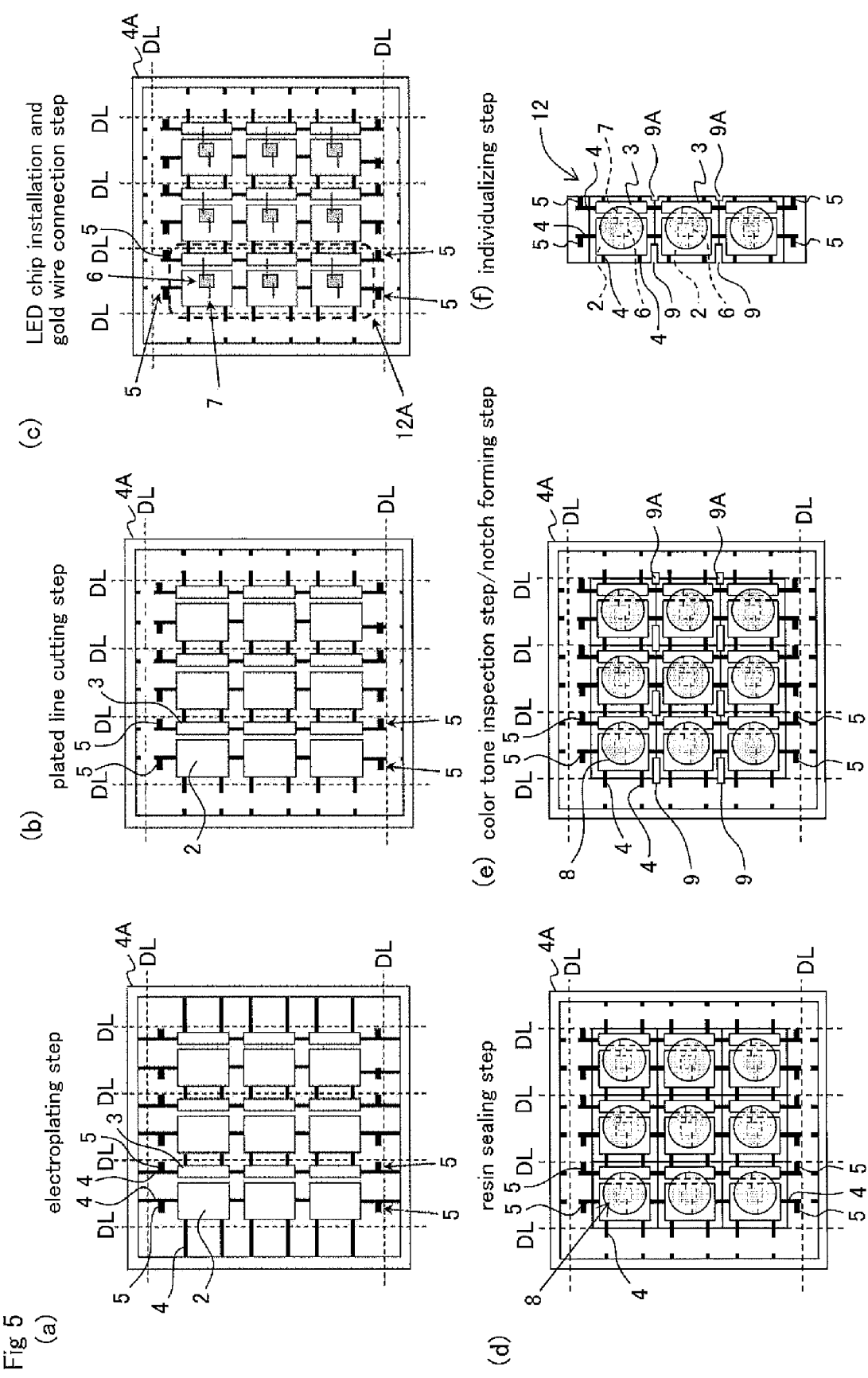

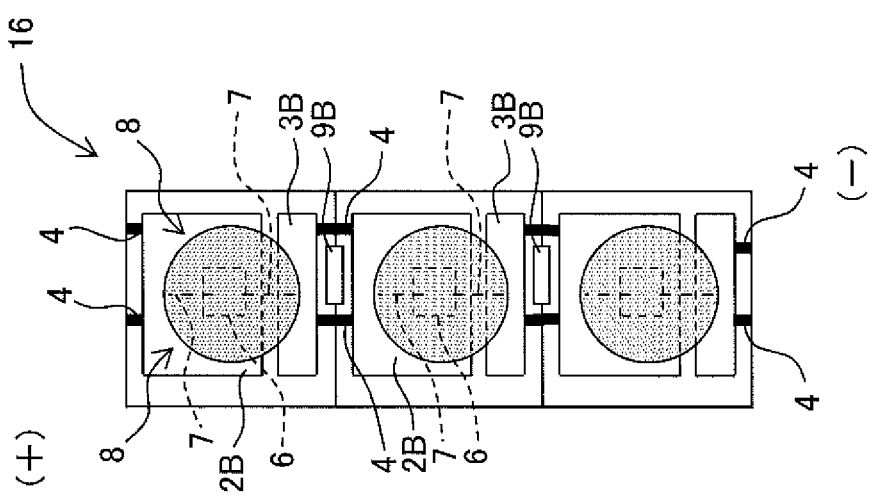
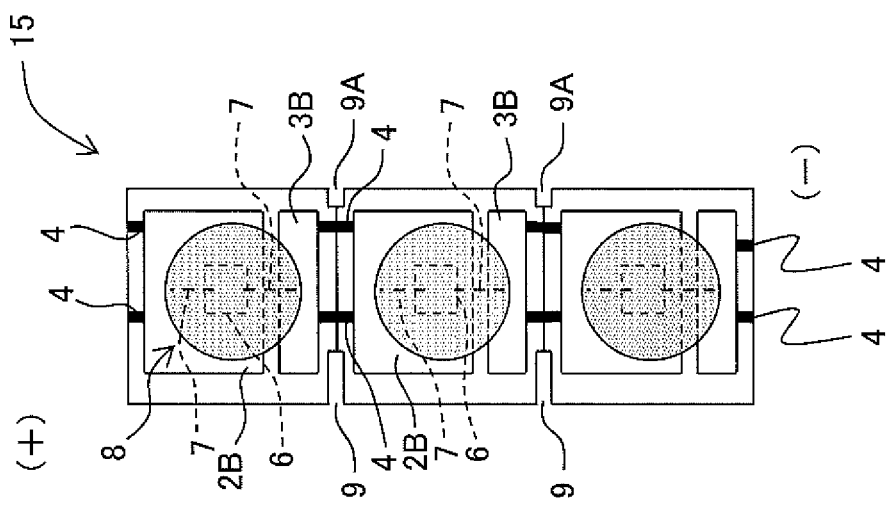

US 9,557,020 B2

COLUMNAR LIGHT EMITTING DEVICE AND MANUFACTURING METHOD OF THE SAME

This application is the U.S. national phase of International Application No. PCT/JP2013/003551 filed 6 Jun. 2013 which designated the U.S. and claims priority to JP 2012-160686 filed 19 Jul. 2012, the entire contents of each of which are hereby incorporated by reference.

TECHNICAL FIELD

The present invention relates to a columnar light emitting device, such as an LED light emitting device and a laser light emitting device, a plurality of which is arranged in a columnar direction and used in an LED module, an LED package or the like, and a method of manufacturing the same.

BACKGROUND ART

Conventionally, there has been LED modules and LED packages as a surface-mounted light emitting device, which is installed with, for example, an LED chip as a light emitting element that is sealed above with a transparent resin on a wiring board. For these LED chips used in LED modules and LED packages, for example a GaN based-blue LED chip is generally used, and the LED chip is generally sealed with a resin sealing material in which a phosphor that can change the wavelength of blue light to white is mixed so that white light is emitted.

FIG. 10 is a plan view showing an example configuration of essential parts of a conventional surface light emitting board disclosed in Patent Literature 1.

In FIG. 10, a conventional surface light emitting board 100 is provided with numerous parallel perforated line sections 102 on a resin substrate 101 to form numerous connected longitudinal substrates 103. In addition, the longitudinal substrates 103 are equipped with a pair of electricity conducting lines 104 that are parallel in the longitudinal direction, and base end sections 105 of the electricity conducting lines 104 are formed to protrude out from the longitudinal substrates 103. Semiconductor light emitting elements 106, and space sections 107 therebetween, are sequentially provided and attached on the resin substrate 101 while being positioned between the pair of electricity conducting lines 104. The semiconductor light emitting element 106 and the pair of electricity conducting lines 104 are linked via a first auxiliary electricity conducting line 108 and a second auxiliary electricity conducting line 109. A transparent acrylic resin layer 110 is provided on the entire side of the surface of the resin substrate 101 to cover over the semiconductor light emitting elements 106 and the pair of electricity conducting lines 104. Top perforated line sections 111 connecting to the numerous parallel perforated line sections 102 provided on the resin substrate 101 are provided across the two layers of the resin substrate 101 and the acrylic resin layer 110 thereon. A lens convex section 112 formed with acrylic resin is provided on the surface of the acrylic resin layer 110 while being positioned on the top surface of each semiconductor light emitting element 106.

Since the top perforated line sections 111 connecting to the numerous parallel perforated line sections 102 provided on the resin substrate 101 are provide on the acrylic resin layer 110, the resin substrate 101 can be readily cut by using a cutting tool such as a pair of scissors through the perforated line section 102 and the top perforated section 111. Further, it is possible to separate the substrate into strip-like separate bodies provided with the semiconductor light emitting elements 106, and space sections 107 provided sequentially, in a column. The strip-like separate bodies can be readily attached to a round object by bending the separated bodies along the curved surface of a product to which the separated bodies are attached.

FIG. 11 is a longitudinal cross-sectional view showing an example configuration of a conventional LED module and a film wiring board disclosed in Patent Literature 2.

As shown in FIG. 11, an LED module and film wiring board 200 comprises an electrical insulation material 201, via holes 202a and 202b penetrating the electrical insulation material 201, a heat dissipating wiring pattern 203a provided on the second surface side of the electrical insulation material 201, a power supplying wiring pattern 203b, and a heat dissipating metal filled section 204a and electrically connecting metal filled section 204b that are electrically connected to a wiring pattern provided in the via holes 202a and 202b. An LED chip 205 is bonded to the first surface side of the electrical insulation material 201 and to tips of the heat-dissipating metal filled section 204a and the electrically connecting metal filled section 204b by using a wire 206. In addition, the LED chip 205 is sealed with a sealing material 207.

A base material 201a, to which an adhesive layer 201b is attached to one surface thereof and a white insulation material 201c is attached to the other surface thereof, is used as the electrical insulation material 201. It is desirable that the base material 201a is a film comprising one of the resins selected from polyimide, polyamide-imide, polyethylene naphthalate, epoxy, and aramid.

CITATION LIST

Patent Literature

Patent Literature 1: Japanese Laid-Open Publication No. 2004-200537
Patent Literature 2: Japanese Laid-Open Publication No. 2012-33855

SUMMARY OF INVENTION

Technical Problem

In the conventional surface light emitting board 100 disclosed in Patent Literature 1, the elongated resin substrate 101 and the acrylic resin layer 110 as a strip-like separated body are configured to sandwich the semiconductor light emitting elements 106 and the pair of electricity conducting lines 104 therebetween. The separated body is attached by bending the separated body along the curved surface of a product to which the separated body is attached. When bending the conventional strip-like surface light emitting board 100, although it is dependent on the degree of bending, there is a risk of an issue occurring, such as breakage of the pair of electricity conducting lines 104, the first auxiliary electricity conducting line 108 or the second auxiliary electricity conducting line 109, when the degree of bending is large.

In the conventional LED module and film wiring board 200 disclosed in Patent Literature 2, the LED chip 205 is installed on the flexible electrical insulation material 201 and sealed with the sealing material 207. When the flexible conventional LED module and film wiring board 200 is installed with a plurality of LED chips 205 and has an elongated shape, if bent, depending on the degree of the bending, there is a risk of an issue occurring, such as the sealing material 207 peeling off or breakage of the wire 206, when the degree of bending is large.

Similarly, FIG. 12 shows an elongated, columnar light emitting device 300. Two conductive regions 301 and 302, corresponding to the ± polarities, are provided on a flexible, soft, and thin film base material. A light emitting element 303 is installed on the two conductive regions 301 and 302 and connected by wire 304. A sealing resin 305 seals the top of the light emitting element 303 and wire 304.

When the elongated columnar light emitting device 300 is warped or bent, issues have occurred such as the sealing resin 305 peeling off or breakage of the wire 304. In any case, it goes without saying that bending of a columnar light emitting device is difficult.

The present invention solves the above-described conventional issues. The objective of the present invention is to provide a columnar light emitting device that can be readily bent without any problems, such as a sealing resin peeling off or breakage of a wire, and a manufacturing method of the same.

Solution Problem

A columnar light emitting device according to the present invention in which a plurality of two conductive regions corresponding to ± polarities are provided on a wiring board in a columnar direction in one or more columns, a light emitting element is connected to each of the plurality of two conductive regions, and each light emitting element is sealed above with a sealing resin is provided, where an opening section is formed between the two conductive regions and the two conductive regions adjacent thereto in the columnar direction, thereby achieving the objective described above.

Preferably, in the columnar light emitting device according to the present invention, the opening section is a notch section and/or a cutout section.

Still preferably, in the columnar light emitting device according to the present invention, the plurality of two conductive regions are connect by a plurality of plated lines in the columnar direction that are needed when plating the two conductive regions, and the notch section is formed on both outer sides of the plurality of plated lines.

Still preferably, in the columnar light emitting device according to the present invention, the plurality of two conductive regions are connect by a plurality of plated lines in the columnar direction that are needed when plating the two conductive regions, and the cutout section is formed between the plurality of plated lines.

Still preferably, in the columnar light emitting device according to the present invention, a power-supplying auxiliary land section having a wider width than a plated line is formed on both edge sections of the plated line in the columnar direction that is needed when plating the two conductive regions.

Still preferably, in the columnar light emitting device according to the present invention, a plated line between the two conductive regions also functions as a power supplying line.

Still preferably, in the columnar light emitting device according to the present invention, the notch section and/or the cutout section is fabricated in a resin film of a film wiring base material on the wiring board.

Still preferably, in the columnar light emitting device according to the present invention, the notch section and/or the cutout section is formed in a resin film between adjacent sealing resin regions in the columnar direction.

Still preferably, in the columnar light emitting device according to the present invention, the notch section and/or the cutout section is at least one of one or more partial or complete squares, one or more partial or complete rectangles, one or more partial or complete circles, one or more partial or complete ellipses and one or more partial or complete obround shapes.

Still preferably, in the columnar light emitting device according to the present invention, the two conductive regions are spaced and insulated from each other while step sections in a plan view are provided on opposing sides of the two conductive regions.

Still preferably, in the columnar light emitting device according to the present invention, the step sections have concave-convex shapes in a plan view for preventing a device from folding or L/L shapes in a plan view for preventing a device from folding, and where the L shapes of the opposing sides of the two conductive regions enter each other while being spaced apart by a predetermined distance.

Still preferably, in the columnar light emitting device according to the present invention, the side with longer sides of the two conductive regions is in the columnar direction or the side with shorter sides of the two conductive regions is in the columnar direction.

Still preferably, in the columnar light emitting device according to the present invention, the wiring board is a flexible film wiring board.

A method of manufacturing a columnar light emitting device according to the present invention, comprising a light emitting element installing step for providing a plurality of two conductive regions corresponding to ± polarities on a wiring board in a columnar direction and connecting a light emitting element to each of the plurality of two conductive regions for installation and a resin sealing step for sealing above each of the LED chips with a sealing resin is provided, where the method comprises an opening section forming step for forming an opening section between the two conductive regions and the two conductive regions adjacent thereto in the columnar direction.

Preferably, in the method of manufacturing a columnar light emitting device according to the present invention, the opening section is formed between adjacent sealing resin regions after the resin sealing step.

Still preferably, in the method of manufacturing a columnar light emitting device according to the present invention, the opening section forming step forms a notch section or a cutout section as the opening section on a resin film between the two conductive regions and the two conductive regions adjacent thereto in the columnar direction and between adjacent sealing resin regions.

Still preferably, in the method of manufacturing a columnar light emitting device according to the present invention, the opening section forming step connects the plurality of two conductive regions by a plurality of plated lines in the columnar direction that are needed when plating the two conductive regions and forms the notch sections on both outer sides of the plurality of plated lines.

Still preferably, in the method of manufacturing a columnar light emitting device according to the present invention, the opening section forming step connects the plurality of two conductive regions by a plurality of plated lines in the columnar direction that are needed when plating the two conductive regions and forms the cutout section between the plurality of plated lines.

With the configuration described above, the functions of the present invention will be described hereinafter.

In the present invention, in a columnar light emitting device in which a plurality of two conductive regions, corresponding to the ± polarities, are provided on a wiring board in the columnar direction, a light emitting element is connected to each of the plurality of two conductive regions, and each light emitting element is sealed above with a sealing resin, an opening section is formed between the two conductive regions and the two conductive regions adjacent thereto in the columnar direction.

In this manner, since an opening section is formed between two conductive regions and the two conductive regions adjacent thereto in the columnar direction, it is possible to readily bend a device without any problems, such as a sealing resin peeling off or breakage of a wire. Furthermore, problems of a plated line peeling off are reduced. A plated line serves as a power supplying line in an elongated light emitting device. Accordingly, reduction of a plated line peeling off can reduce failure of a light emitting device lighting up. In a case of a columnar light emitting device, breakage in one location of a plated line causes a complete failure to light up.

Advantageous Effects of Invention

According to the present invention as described above, since an opening section is formed between two conductive regions and the two conductive regions adjacent thereto in the columnar direction, it is possible to readily bend a device without any problems, such as breakage in a plated line (power supplying pattern or a wiring pattern in case of a columnar light emitting device), a sealing resin peeling off, or breakage of a wire.

BRIEF DESCRIPTION OF THE DRAWINGS

FIG. 2 is a plan view for explaining a manufacturing method of the plurality of LED columnar light emitting devices of FIG. 1. FIG. 2(a) is a plan view showing the electroplating step thereof. FIG. 2 (b) is a plan view showing the plated line cutting step thereof. FIG. 2(c) is a plan view showing the LED chip and gold wire connection step thereof. FIG. 2(d) is a plan view showing a resin sealing step thereof. FIG. 2(e) is a plan view showing the color tone inspection step/notch forming step thereof. FIG. 2(f) is a plan view showing the individualizing step thereof.

FIG. 3 is a plan view showing an example configuration of essential parts of an LED columnar light emitting device in Embodiment 2 of the present invention.

FIG. 4 is a plan view for explaining a manufacturing method of the plurality of LED columnar light emitting devices of FIG. 3. FIG. 4(a) is a plan view showing the electroplating step thereof. FIG. 4(b) is a plan view showing the plated line cutting step thereof. FIG. 4(c) is a plan view showing the LED chip and gold wire connection step thereof. FIG. 4(d) is a plan view showing the resin sealing step thereof. FIG. 4(e) is a plan view showing the color tone inspection step/notch forming step thereof. FIG. 4(f) is a plan view showing the individualizing step thereof.

FIG. 5 is a plan view for explaining a manufacturing method of an LED columnar light emitting device in Embodiment 3 of the present invention. FIG. 5(a) is a plan view showing the electroplating step thereof. FIG. 5(b) is a plan view showing the plated line cutting step thereof. FIG. 5(c) is a plan view showing the LED chip and gold wire connection step thereof. FIG. 5(d) is a plan view showing the resin sealing step thereof. FIG. 5(e) is a plan view showing the color tone inspection step thereof. FIG. 5(f) is a plan view showing the individualizing step thereof.

FIG. 8 is a plan view showing an example configuration of essential parts of an LED columnar light emitting device in Embodiment 5 of the present invention.

FIG. 9 is a plan view showing another example configuration of essential parts of the LED columnar light emitting device in Embodiment 5 of the present invention.

Figure 1:
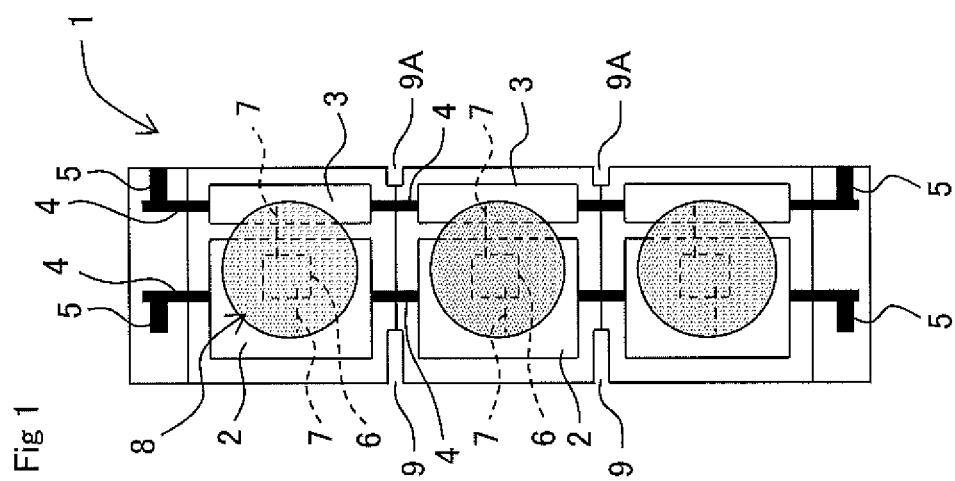
FIG. 1 is a plan view showing an example configuration of essential parts of an LED columnar light emitting device in Embodiment 1 of the present invention.

REFERENCE NUMERAL LIST 1, 11-15 LED columnar light emitting device
1A, 11A, 12A LED columnar light emitting section
2, 3, 2A, 3A, 2B, 3B conductive region
4, plated line
4A annular outer circumferential conductive edge section
5 auxiliary land
6 LED chip
7 gold wire
8 transparent sealing resin
9, 9A notch section (opening section)
9B cutout section (opening section)

DESCRIPTION OF EMBODIMENTS

Hereinafter, a columnar light emitting device and a manufacturing method thereof of the present invention, when applied in Embodiments 1-5 of the LED columnar light emitting device and manufacturing method thereof, is explained in detail while referring to the Figures. In addition, from the standpoint of creating the Figures, the thickness, length, and the like of each constituent member in each Figure is not limited to the illustrated configuration.

(Embodiment 1)

FIG. 1 is a plan view showing an example configuration of essential parts of an LED columnar light emitting device in Embodiment 1 of the present invention.

In FIG. 1, a plurality (9 in 3 columns and 3 rows are shown herein, but is actually, for example, 380 in 19 columns and 20 rows) of two conductive regions 2 and 3, corresponding to the ± polarities, are disposed in a columnar direction in an LED columnar light emitting device 1 of Embodiment 1. Between the two conduction regions 2 and 3 in the columnar direction and the conductive regions 2 and 3 adjacent thereto on the top and bottom two plated lines 4 are connected only in the columnar direction and hold the plurality of two conductive regions 2 and 3 in the columnar direction. Further, an auxiliary land 5 for applying a voltage with a greater area than the lines is disposed part way through on each of both end sections of the cut, plated lines 4 in the columnar direction.

An LED chip 6 is bonded by die bonding on each of the conductive regions 2 of a film wiring board. Furthermore, each of both electrode terminals of each LED chip 6 and each of the two conductive regions 2 and 3, corresponding to the ± polarities, are bonded by wire bonding with a gold wire 7. When a positive voltage is applied to the auxiliary land 5 on the side of the plurality (herein three) of the conductive regions 2 in the columnar direction and a negative voltage is applied to the auxiliary land 5 on the side of the plurality (herein three) of conductive regions 3 in the columnar direction, the plurality (herein three) of LED columnar light emitting devices 1 in parallel in the columnar direction would emit light.

Each of the plurality of LED chips 6 and gold wires 7 is sealed above, in a circular shape in a plan view, by a transparent sealing resin 8 such as a silicon resin, in which a predetermined amount of phosphor is mixed at a predetermined ratio, on a film wiring board where each LED chip 6 is installed.

In the LED columnar light emitting device 1, notch sections 9 and 9A, as opening sections, are formed on both sides in the width direction between the two conductive regions 2 and 3 and the LED chip 6 thereon and the two conductive regions 2 and 3 adjacent thereto in the columnar direction and an LED chip 6 thereon. The notch sections 9 and 9A are formed by a mold in both outer sides of the two plated lines 4. The space between the two conductive regions 2 and 3 and the two conductive regions 2 and 3 adjacent thereto in the columnar direction is comprised of a polyimide film of the film wiring base material. In addition, the polyimide film of the film wiring base material can be readily processed. Thus, the notch sections 9 and 9A with a partially rectangular shape in a plan view are formed in the polyimide film of the film wiring base material. The notch sections 9 and 9A are optimally formed after forming a sealing resin. The notch sections 9 and 9A are formed on the outside of the two conductive regions 2 and 3 and the sealing resin 8 while avoiding the plated line 4.

Thereby, since the notch sections 9 and 9A with a partially rectangular shape, as opening sections, are disposed on both outer sides of the two plated lines 4 between the two conductive regions 2 and 3 and the two conductive regions 2 and 3 adjacent thereto in the columnar direction in the LED columnar light emitting device 1 of Embodiment 1, the LED columnar light emitting device 1 of Embodiment 1, when bent, can be primarily bent at the notch sections 9 and 9A. Thus, there is no problem such as breakage of the plated line 4, the transparent sealing resin 8 peeling off, or breakage of the gold wire 7 as in conventional techniques and it is possible to bend the LED columnar light emitting device 1 readily and safely.

The manufacturing method of the plurality of LED columnar light emitting device 1 is explained herein in detail.

FIG. 2 is a plan view for explaining a manufacturing method of the plurality of LED columnar light emitting device 1 of FIG. 1. FIG. 2(*a*) is a plan view showing the electroplating step thereof. FIG. 2 (*b*) is a plan view showing the plated line cutting step thereof. FIG. 2(*c*) is a plan view showing the LED chip installation and gold wire connection step thereof. FIG. 2(*d*) is a plan view showing the resin sealing step thereof. FIG. 2(*e*) is a plan view showing the color tone inspection step/notch forming step thereof. FIG. 2(*f*) is a plan view showing the individualizing step thereof.

As shown in FIG. 2(*a*), a plurality (9 in 3 columns and 3 rows are shown herein, but is actually 380 in 19 columns and 20 rows) of the two conductive regions 2 and 3, corresponding to the ± polarities, are disposed on the film wiring board two dimensionally in a matrix. Between the two conductive regions 2 and 3 disposed in a matrix and the two conductive regions 2 and 3 adjacent thereto on the top and bottom, the two plated lines 4 are connected only in the columnar direction and hold the plurality (herein three) of two conductive regions 2 and 3 in a matrix. A predetermined voltage is applied to the plated line 4 in the columnar direction and the copper foil surface of the two conductive regions 2 and 3 are subjected to plating. Further, the plated line 4 is connected to an annular outer circumference conductive edge section 4A of the film wiring board at both end sections of the plated line 4 in the columnar direction of a film wiring board.

In the manufacturing method of the plurality of LED columnar light emitting devices 1 of Embodiment 1, first, a predetermined voltage is applied to the two conductive regions 2 and 3 via the plated line 4 in only the columnar direction for electroplating processing as shown in the electroplating step of FIG. 2(*a*). At this time, all the plated lines 4 in the columnar direction are connected to the annular outer circumference conductive edge section 4A of the thin and soft film wiring board. A predetermined voltage is applied thereto, so that all of the two conductive regions 2 and 3 can have the predetermined voltage and electroplating processing can be applied to the two conductive regions 2 and 3 and the outer circumference conductive edge section 4A.

Next, as shown in the plated line cutting step of FIG. 2 (*b*), connections between both edge sections of the plated lines 4 in the columnar direction in the film wiring board and the annular outer circumference conductive edge section 4A of the film wiring board are cut by laser or etching processing, etc.

Subsequently, as shown in the LED chip installation and gold wire connection step (light emitting element installing step) of FIG. 2(*c*), the LED chip 6 is installed by die-bonding on each of the conductive regions 2. In addition, both electrodes of the LED chip 6 are each bonded to the two conductive regions 2 and 3 with gold wire 7 by wire bonding.

Subsequently, as shown in the resin sealing step of FIG. 2(*d*), each of the LED chips 6 and gold wires 7 is sealed above, in a circular shape or the like in a plan view, by the transparent sealing resin 8 such as a silicon resin, in which a predetermined phosphor is mixed at a predetermined ratio. For example, when the blue LED chip 6 is used, the chip is sealed with a transparent resin sealing material (transparent sealing resin 8), in which a predetermined amount of phosphor (red and green light) that can change the wavelength of blue light to white is mixed at a predetermined ratio, to allow irradiation of white light by blue, red and green light.

As shown in the color tone inspection step of FIG. 2(*e*), then a positive voltage is applied to the auxiliary land 5 on the side of a plurality (herein three) of conductive regions 2 in the columnar direction and a negative voltage is applied to auxiliary land 5 on the side of a plurality (herein three) of conductive regions 3 in the columnar direction to enable light emission by a plurality (herein three) of parallel LED columnar light emitting sections 1A in the columnar direction surrounded by the dotted line in FIG. 2(*c*). In FIG. 2(*e*), the plurality (herein three) of parallel LED sections 1A are allowed to emit light under the transparent sealing resin 8 for conducting a color tone inspection of light passing through the transparent sealing resin 8. Phosphor mix information for a target phosphor amount based on results of the color tone inspection is quickly fed back into the resin sealing step for an adjustment of color tone.

Subsequently, as shown in the notch forming step of FIG. 2(e), the notch sections 9 and 9A are formed together, by a mold as opening sections, in a polyimide film, between the two conductive regions 2 and 3 and the two conductive regions 2 and 3 adjacent thereto in the columnar direction and on both outer sides of the two plated lines 4.

Next, as shown in the individualization step of FIG. 2(f) after a protective tape (not shown) is attached to the side of the plurality of LED light emitting devices disposed in a matrix, the substrate is cut by a dicing blade along an individualization cut line DL shown by a dotted line at each space between the LED light emitting devices 1 to individualize the substrate into a plurality of LED columnar light emitting devices 1.

In summary, the manufacturing method of the LED columnar light emitting device 1 of Embodiment 1 comprises: a light emitting element installing step for providing the plurality of two conductive regions 2 and 3, corresponding to the ± polarities, on a film wiring board and connecting the LED chip 6, as each light emitting element, to each of the plurality of two conductive regions 2 and 3 using a polymer of any one of claims 1 to 10 as a dispersant for installation; a resin sealing step for sealing each of the LED chips 6 and the gold wires 7 above with the transparent sealing resin 8; and an opening section forming step for forming the notch sections 9 and 9A as opening sections between the two conductive regions and another two conductive regions 2 and 3 adjacent thereto in the columnar direction after the resin sealing step.

According to Embodiment 1 from the above, in the LED columnar light emitting device 1, the plurality of two conductive regions 2 and 3, corresponding to the ± polarities, are provided in the columnar direction on a film wiring board; each light emitting element is connected to and installed on the plurality of two conductive regions 2 and 3; each LED chip 6, as each light emitting element, is sealed above with the transparent sealing resin 8; and the notch sections 9 and 9A are formed on both outer sides of the two plated lines 4 as opening sections between the two conductive regions 2 and 3 and another two conductive regions 2 and 3 adjacent thereto in the columnar direction.

In this manner, since the notch sections 9 and 9A are formed on both outer sides of the two plated lines 4 between the two conductive regions 2 and 3 and another two conductive regions 2 and 3 adjacent thereto in the columnar direction, the LED columnar light emitting device 1 of Embodiment 1, when bent, can be primarily bent at the notch sections 9 and 9A. Thus, there is no breakage of the plated line 4, peeling off of the transparent sealing resin 8 or breakage of the gold wire 7 as in conventional techniques, and it is possible to bend the LED columnar light emitting device 1 readily and safely. In addition, the problem of the plated line 4 peeling off is reduced. The plated line 4 is a power supply line in the elongated LED light emitting device 1 (in the case of a light emitting device, it is a power supplying pattern or a wiring pattern). Accordingly, the reduction in peeling of the plated line 4 can reduce failure of the elongated LED light emitting device lighting up. In the case of the elongated light emitting device 1, breakage in one location of a plated line 4 causes a complete failure to light up.

(Embodiment 2)

The above-described Embodiment 1 explains a case of forming the notches 9 and 9A in a polyimide film on both outer sides of the two plated lines 4. However, Embodiment 2 explains a case of forming a cutout section 9B in a polyimide film between the two plated lines 4.

FIG. 3 is a plan view showing an example configuration of essential parts of an LED columnar light emitting device in Embodiment 2 of the present invention.

In FIG. 3, in an LED columnar light emitting device 11 of Embodiment 2, a plurality (9 in 3 columns and 3 rows are shown herein, but is actually, for example, 380 in 19 columns and 20 rows) of two conductive regions 2 and 3, corresponding to the ± polarities, are disposed in the columnar direction on a film wiring board. Between the two conductive regions 2 and 3 in the columnar direction and the two conductive regions 2 and 3 adjacent thereto in the top and bottom, two plated lines 4 are connected only in the columnar direction and hold the plurality of two conductive regions 2 and 3 in the columnar direction. Further, an auxiliary land 5 for applying a voltage with a greater area than the lines is disposed part way through on each of both end sections of the cut plated line 4 in the columnar direction.

An LED chip 6 is bonded by die bonding on each of the conductive regions 2 on a film wiring board. Furthermore, both electrode terminals of each LED chip 6 are each bonded by wire bonding with a gold wire 7 to the conductive regions 2 and 3, corresponding to the ± polarities. When a positive voltage is applied to the auxiliary land 5 on the side of the three conductive regions 2 in the columnar direction and a negative voltage is applied to the auxiliary land 5 on the side of the three conductive regions 3 in the columnar direction, the three LED columnar light emitting devices 11 in parallel in the columnar direction would emit light.

Each of the plurality of LED chips 6 and gold wires 7 is sealed above, in a circular shape or the like in a plan view, by a transparent sealing resin 8 such as a silicon resin, in which a predetermined amount of phosphor is mixed at a predetermined ratio, on a film wiring board where each LED chip 6 is installed.

In the LED columnar light emitting device 11, a cutout section 9B is formed in the center section in the width direction between the two plated lines 4 and between the two conductive regions 2 and 3 and the LED chip 6 thereon and the two conductive regions 2 and 3 adjacent thereto in the columnar direction and an LED chip 6 thereon. The space between the two conductive regions 2 and 3 and the two conductive regions 2 and 3 adjacent thereto in the columnar direction is comprised of a polyimide film of a film wiring base material. In addition, the polyimide film of the film wiring base material can be readily processed. Thus, the cutout section 9B with a rectangular shape in a plan view is formed in the polyimide film of the film wiring base material between the two plated lines 4. The cutout section 9B is optimally formed after forming a sealing resin. The notch section 9B is formed on the outside of the two conductive regions 2 and 3 and the sealing resin 8.

Since the rectangular cutout section 9B with a rectangular shape in a plan view, as opening sections, is thereby disposed between the two plated lines 4 between the two conductive regions 2 and 3 and the two conductive regions 2 and 3 adjacent thereto in the columnar direction in the LED columnar light emitting device 11 of Embodiment 2, the LED columnar light emitting device 11 of Embodiment 2, when bent, can be primarily bent at the cutout section 9B. Thus, there is no issue such as breakage of the plated line 4, peeling off of the transparent sealing resin 8 or breakage of the goldwire 7 as in conventional techniques, and it is possible to bend the LED columnar light emitting device 11 readily and safely.

A manufacturing method of the plurality of LED columnar light emitting device 11 is explained herein in detail.

FIG. 4 is a plan view for explaining a manufacturing method of the plurality of LED columnar light emitting devices 11 of FIG. 3. FIG. 4(*a*) is a plan view showing the electroplating step thereof. FIG. 4(*b*) is a plan view showing the plated line cutting step thereof. FIG. 4(*c*) is a plan view showing the LED chip installation and gold wire connection step thereof. FIG. 4(*d*) is a plan view showing a resin sealing step thereof. FIG. 4(*e*) is a plan view showing the color tone inspection step/cutout forming step thereof. FIG. 4(*f*) is a plan view showing the individualizing step thereof.

In the manufacturing method of the plurality of LED columnar light emitting devices 11 of Embodiment 2, first, a predetermined voltage is applied to the two conductive regions 2 and 3 via the plated lines 4 in only the columnar direction for electroplating processing as shown in the electroplating step of FIG. 4(*a*). At this time, all columnar direction plated lines 4 are connected to an annular outer circumference conductive edge section 4A of a thin and soft film wiring board. A predetermined voltage is applied thereto so that all of the two conductive regions 2 and 3 have the predetermined voltage and electroplating can be applied to the two conductive regions 2 and 3 and the outer circumference conductive edge section 4A.

Next, as shown in the plated line cutting step of FIG. 4(*b*), connections between both edge sections of the columnar direction plated line 4 in the film wiring board and the annular outer circumference conductive edge section 4A of the film wiring board are cut by laser or etching processing.

Subsequently, as shown in the LED chip installation and gold wire connection step (light emitting element installing step) of FIG. 4(*c*), the LED chip 6 is installed on each of the conductive regions 2. In addition, both electrodes of the LED chip 6 and the two conductive regions 2 and 3 are each bonded with gold wire 7 by wire bonding.

Subsequently, as shown in the resin sealing step of FIG. 4(*d*), each of the LED chips 6 and gold wires 7 is sealed above, in a circular shape in a plan view, by the transparent sealing resin 8 such as silicon, in which a predetermined phosphor is mixed at a predetermined ratio. For example, when the blue LED chip 6 is used, the chip is sealed with a transparent resin sealing material (transparent sealing resin 8) in which a predetermined amount of phosphor (red and green light) that can change the wavelength of blue light into white is mixed at a predetermined ratio, to allow irradiation of white light by blue, red and green light.

As shown in the color tone inspection step of FIG. 4(*e*), the auxiliary land 5 on the side of the three conductive regions 2 in the columnar direction is then applied with a positive voltage and the auxiliary land 5 on the side of the three conductive regions 3 in the columnar direction is applied with a negative voltage to enable light emission of three parallel LED columnar light emitting sections 11A in the columnar direction surrounded by the dotted line in FIG. 4(*c*). In FIG. 4(*e*), the three parallel LED sections 11A are allowed to emit light under the transparent sealing resin 8 for conducting a color tone inspection of light passing through the transparent sealing resin 8. Phosphor mix information for a target phosphor amount based on results of the color tone inspection is quickly fed back into the resin sealing step for an adjustment of color tone.

Subsequently, as shown in the cutout forming step of FIG. 4(*e*), the cutout section 9B is formed in a polyimide film between the two conductive regions 2 and 3 and the two conductive regions 2 and 3 adjacent thereto in the columnar direction and between the two plated lines 4.

Next, as shown in the individualization step of FIG. 4(*f*), after a protective tape is attached to the side of the plurality of LED light emitting devices disposed in a matrix, the substrate is cut by a dicing blade along an individualization cut line DL shown by a dotted line at each space between the LED columnar light emitting devices 11 to individualize the substrate into the plurality of LED columnar light emitting devices 11.

In summary, the manufacturing method of the LED columnar light emitting devices 11 of Embodiment 2 comprises: a light emitting element installing step for providing the plurality of two conductive regions 2 and 3, corresponding to the ± polarities, on a film wiring board and connecting the LED chip 6, as each light emitting element, to each of the plurality of two conductive regions 2 and 3 for installation; a resin sealing step for sealing above each of the LED chips 6 and the gold wires 7 with the transparent sealing resin 8; and an opening section forming step for forming the cutout section 9B as an opening section between the two conductive regions 2 and 3 and another two conductive regions 2 and 3 adjacent thereto in the columnar direction after the resin sealing step.

According to Embodiment 2 from the above, since the cutout section 9B is formed between the two plated lines 4 between the two conductive regions 2 and 3 and another two conductive regions 2 and 3 adjacent thereto in the columnar direction, the LED columnar light emitting device 11 of Embodiment 2, when bent, can be primarily bent at the cutout section 9B. Thus, there is no breakage of the plated line 4, peeling off of the transparent sealing resin 8, or breakage of the gold wire 7 as in conventional techniques, and it is possible to bend the LED columnar light emitting device 11 readily and safely.

(Embodiment 3)

The above-described Embodiments 1 and 2 explain a case in which the plated lines 4 are connected only in the columnar direction and hold the numerous two conductive regions 2 and 3 in a matrix and the plated lines 4 are separated from the annular outer circumference conductive edge section 4A after plating. However, Embodiment 3 explains a case in which plated lines 4 are connected in the columnar and row directions and hold numerous two conductive regions 2 and 3 in a matrix, and both ends of the plated lines 4 are separated from an annular outer circumference conductive edge section 4A in both the columnar and row directions after plating.

FIG. 5 is a plan view for explaining a manufacturing method of an LED columnar light emitting device in Embodiment 3 of the present invention. FIG. 5(*a*) is a plan view showing the electroplating step thereof. FIG. 5(*b*) is a plan view showing the plated line cutting step thereof. FIG. 5(*c*) is a plan view showing the LED chip installation and gold wire connection step thereof. FIG. 5(*d*) is a plan view showing a resin sealing step thereof. FIG. 5(*e*) is a plan view showing the color tone inspection step thereof. FIG. 5(*f*) is a plan view showing the individualizing step thereof.

In a manufacturing method of a plurality of LED columnar light emitting devices 12 of Embodiment 3, first, a predetermined voltage is applied to a plurality of two conductive regions 2 and 3 via a plurality of plated lines 4 in columnar and row directions for electroplating processing as shown in the electroplating step of FIG. 5(*a*). At this time, the plurality of plated lines 4 in all columnar and row directions are connected to an annular outer circumference conductive edge section 4A of a thin and soft film wiring board. A predetermined voltage is applied thereto, so that all of the two conductive regions 2 and 3 can have the predetermined voltage and electroplating processing can be applied to the two conductive regions 2 and 3 and the outer circumference conductive edge section 4A.

Next, as shown in the plated line cutting step of FIG. 5(*b*), connections between both edge sections of the plurality of plated lines 4 in the columnar and row directions in the film wiring board and the annular outer circumference conductive edge section 4A of the film wiring board are cut by laser or etching processing, etc.

Subsequently, as shown in the LED chip installation and gold wire connection step of FIG. 5(*c*), an LED chip 6 is installed on each conductive region 2. The LED chip 6 is bonded to each of the two conductive regions 2 and 3 by wire bonding with gold wire 7.

Subsequently, as shown in the resin sealing step of FIG. 5(*d*), each of the LED chips 6 and gold wires 7 is sealed above, in a circular shape or the like in a plan view, by a transparent sealing resin 8 such as silicon, in which a predetermined phosphor is mixed at a predetermined ratio. For example, when the blue LED chip 6 is used, the chip is sealed with a transparent resin sealing material (transparent sealing resin 8), in which a predetermined amount of phosphor (red and green light) that can change the wavelength of blue light to white is mixed at a predetermined ratio, to allow irradiation of white light with blue, red and green light.

As shown in the color tone inspection step of FIG. 5(*e*), a positive voltage is applied to an auxiliary land 5 on the side of three conductive regions 2 in the columnar direction and a negative voltage is applied to an auxiliary land 5 on the side of three conductive regions 3 in the columnar direction to enable light emission by three parallel LED columnar light emitting sections 12A in the columnar direction surrounded by the dotted line in FIG. 5(*c*). In FIG. 5(*e*), the three parallel LED sections 12A are allowed to emit light under the transparent sealing resin 8 for conducting a color tone inspection of light passing through the transparent sealing resin 8. Phosphor mix information for a target phosphor amount based on results of the color tone inspection is quickly fed back into the resin sealing step for an adjustment of color tone.

Subsequently, as shown in the notch forming step of FIG. 5(*e*), notch sections 9 and 9A are formed in a polyimide film, between the two conductive regions 2 and 3 and the two conductive regions 2 and 3 adjacent thereto in the columnar direction and on both outer sides of the two plated lines 4.

Next, as shown in the individualization step of FIG. 5(*f*), after a protective tape (not shown) is attached to the side of the plurality of LED light emitting devices disposed in a matrix on a substrate sealed with a transparent resin, the substrate is cut by a dicing blade along an individualization cut line DL shown by a dotted line at each space between the LED light emitting devices to individualize the substrate into the plurality of LED columnar light emitting devices 12.

According to Embodiment 3 from the above, since the notch sections 9 and 9A are formed on both outer sides of the two plated lines 4 between the two conductive regions 2 and 3 and another two conductive regions 2 and 3 adjacent thereto in the columnar direction when the plated lines 4 are connected in the columnar and row directions and hold the numerous two conductive regions 2 and 3 in a matrix, the LED columnar light emitting device 12 of Embodiment 3, when bent, can be primarily bent at the notch sections 9 and 9A. Thus, there is no breakage of a plated line, peeling off of a sealing resin or breakage of a wire as in conventional techniques. A similar effect can be achieved even when the cutout section 9B of Embodiment 2 described above is used instead of the notch sections 9 and 9A of Embodiment 3.

(Embodiment 4)

The above-described Embodiments 1-3 explain a case in which sides of the two conductive regions 2 and 3 opposing each other are parallel in a plan view. However, Embodiment 4 explains a case in which sides of two conductive regions 2 and 3 have concave-convex shapes in a plan view.

Figure 6:
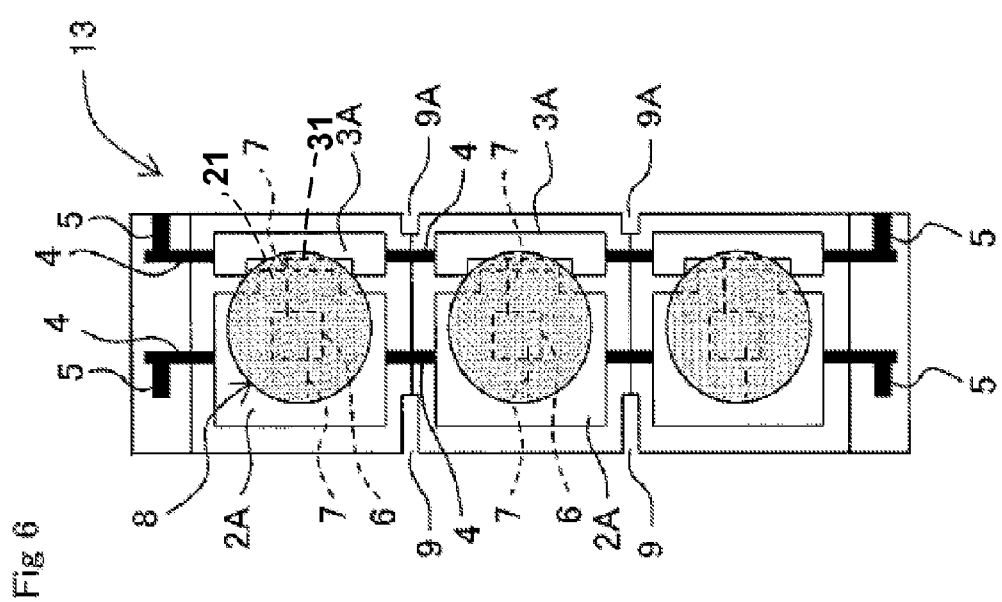
FIG. 6 is a plan view showing an example configuration of essential parts of an LED columnar light emitting device in Embodiment 4 of the present invention.
Figure 10:
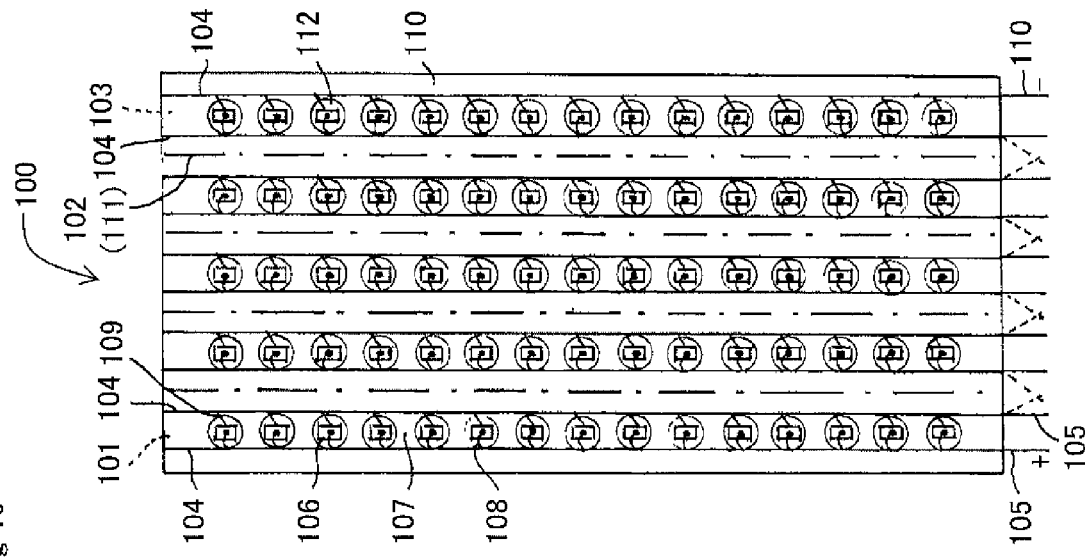
FIG. 10 is a plan view showing an example configuration of essential parts of a conventional surface light emitting board disclosed in Patent Literature 1.
Figure 11:
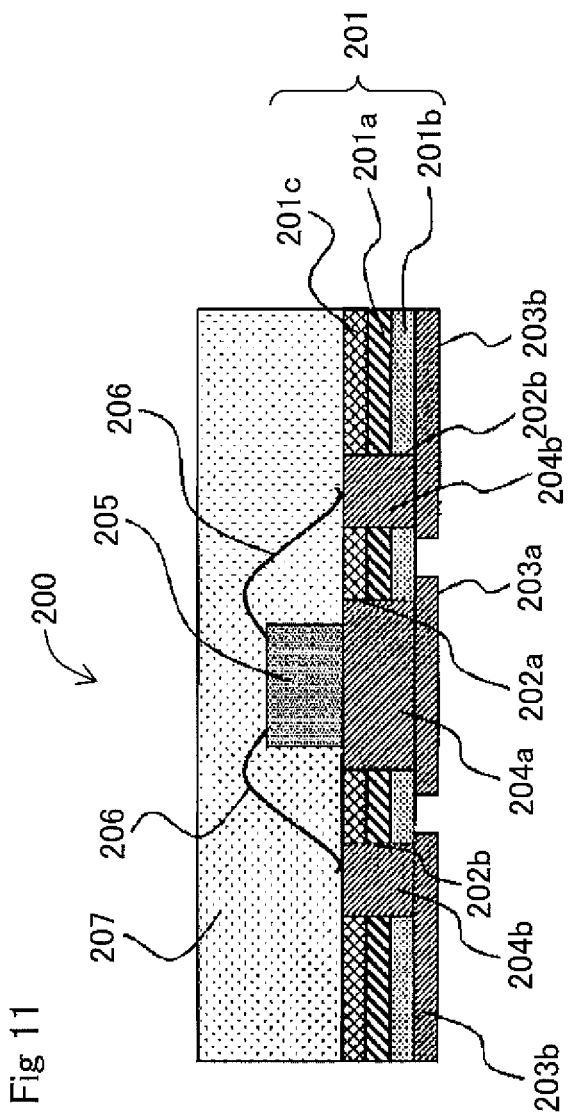
FIG. 11 is a longitudinal cross-sectional view showing an example configuration of a conventional LED module and a film wiring board disclosed in Patent Literature 2.
Figure 12:
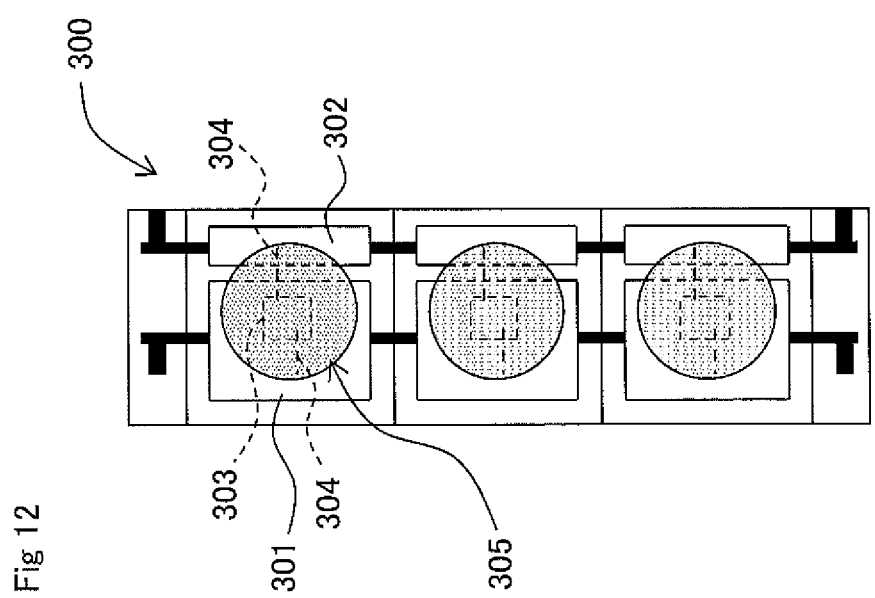
FIG. 12 is a plan view showing one example configuration of an LED columnar light emitting device.

FIG. 6 is a plan view showing an example configuration of essential parts of an LED columnar light emitting device in Embodiment 4 of the present invention.

In FIG. 6, a plurality (herein three) of two conductive regions 2A and 3A, corresponding to the ± polarities, are disposed in the columnar direction in an LED columnar light emitting device 13 of Embodiment 4. Between the two conductive regions 2A and 3A and the two conductive regions 2A and 3A adjacent thereto on the top and bottom (columnar direction), two plated lines 4 are connected only in a columnar direction and hold the plurality (herein three) of two conductive regions 2A and 3A in the columnar direction. Further, an auxiliary land 5 for applying a voltage with a greater area than the lines is disposed part way through on each of both end sections of the cut plated line 4 in the columnar direction.

The two conductive regions 2A and 3A are spaced and insulated from each other while step sections 21, 31 in a plan view are provided on opposing sides of the two conductive regions 2A and 3A. Specifically, the step sections 21, 31 have concave-convex shapes in a plan view for preventing a device from folding (or alternatively may have L/L shapes in a plan view for preventing a device from folding, where L shapes of opposing sides of two conductive regions enter each other while being spaced apart a predetermined distance). The concave-convex shapes in a plan view fit each other while the opposing sides of the two conductive regions 2A and 3A are spaced a predetermined distance. In summary, the tip side with a convex shape in a plan view of the conductive region 2A is disposed to enter into a concave section of a concave shape in a plan view of the conductive region 3A. When a straight line is drawn along the sides between both tip sides of the concave section with a concave shape in a plan view of the conductive region 3A, the tip side with a convex shape in a plan view of the conductive region 2A is on the straight line or passes the straight line to enter the concave section. Thereby, a device is prevented from folding in a longitudinal direction. Concave-convex shapes in a plan view for preventing a device from folding consists of a convex shape in a plan view of the conductive region 2A and a concave shape in a plan view of the conductive region 3A. However, the shapes may be reversed. Specifically, the tip side of a convex shape in a plan view of the conductive region 3A may be configured to enter a concave section of a concave shape in a plan view of the conductive region 2A.

An LED chip 6 is bonded by die bonding on each of the conductive regions 2A on a film wiring board. Furthermore, each of both electrode terminals of each LED chip 6 is bonded by wire bonding with gold wire 7 to the two conductive regions 2A and 3A, corresponding to the ± polarities. When a positive voltage is applied to the auxiliary land 5 on the side of the three conductive regions 2A in the columnar direction and a negative voltage is applied to the auxiliary land 5 on the side of the three conductive regions 3 in the columnar direction, three parallel LED columnar light emitting devices 13 in the columnar direction would emit light.

Each of the plurality of LED chips 6 and gold wires 7 is sealed above, in a circular shape or the like in a plan view, by a transparent sealing resin 8 such as a silicon resin, in which a predetermined amount of phosphor is mixed at a predetermined ratio, on a film wiring board where each LED chip 6 is installed.

In the LED columnar light emitting device 13, notch sections 9 and 9A with a partially rectangular shape in a plan view, as opening sections, are formed on both sides in the width direction between the two conductive regions 2A and 3A and the LED chip 6 thereon and the two conductive regions 2A and 3A adjacent thereto in the columnar direction and an LED chip 6 thereon. The notch sections 9 and 9A are formed on both outer sides of the two plated lines 4. The space between the two conductive regions 2A and 3A and the two conductive regions 2A and 3A adjacent thereto in the columnar direction is comprised of a polyimide film of a film wiring base material. In addition, the polyimide film of the film wiring base material can be readily processed. Thus, the notch sections 9 and 9A with a partially rectangular shape in a plan view are formed together, by pressing with a mold, in the polyimide film of the film wiring base material. The notch sections 9 and 9A are optimally formed after forming a sealing resin. The notch sections 9 and 9A are formed in the polyimide film, which is a resin film on the outer side of the two conductive regions 2A and 3A and the sealing resin 8.

Since the notch sections 9 and 9A are thereby disposed on both outer sides of the two plated lines 4 between the two conductive regions 2A and 3A and the two conductive regions 2A and 3A adjacent thereto in the columnar direction in the LED columnar light emitting device 13 of Embodiment 4, the LED columnar light emitting device 13 of Embodiment 4 having the two conductive regions 2A and 3A with concave-convex shapes in a plan view for preventing a device from folding, when bent, can be primarily bent at the notch sections 9 and 9A. Thus, there is no breakage of the plated line 4, peeling off of the transparent sealing resin 8 or breakage of the gold wire 7 as in conventional techniques and it is also possible to bend the LED columnar light emitting device 13 readily and safely.

Embodiment 4 explains a case of forming the notch sections 9 and 9A, as opening sections, by pressing using a mold, in a polyimide film on both outer sides of the two plated lines 4 in the LED columnar light emitting device 13 of Embodiment 4 having the two conductive regions 2A and 3A with concave-convex shapes in a plan view for preventing a device from folding. However, the present invention is not limited thereto. A cutout section 9B, as opening sections, may be formed in a polyimide film between the two plated lines 4.

Figure 7:
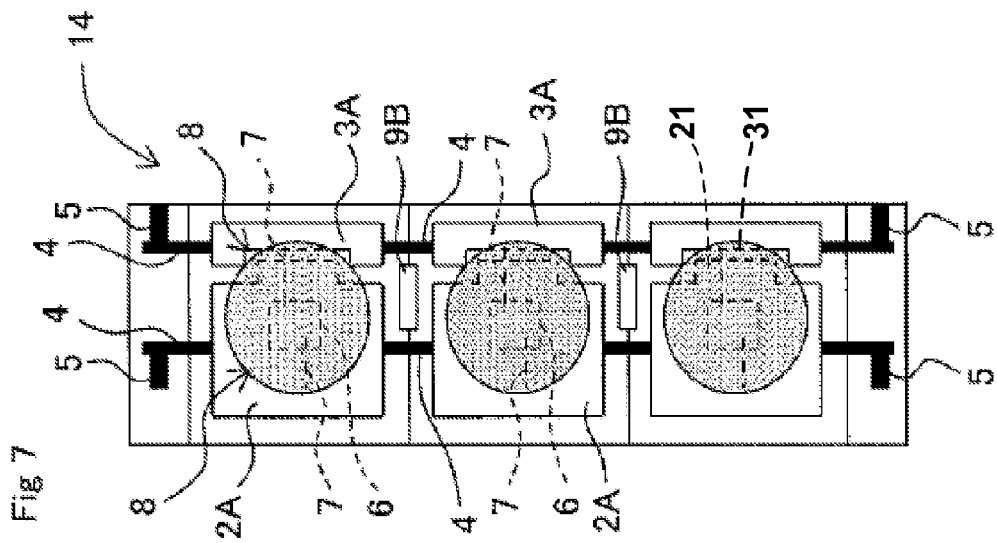
FIG. 7 is a plan view showing another example configuration of essential parts of the LED columnar light emitting device in Embodiment 4 of the present invention.

FIG. 7 is a plan view showing another example configuration of essential parts of the LED columnar light emitting device in Embodiment 4 of the present invention. In FIG. 7, constituent members achieving the same working effect as the constituent members of FIG. 6 are assigned with the same reference numeral and the explanation thereof is omitted.

As shown in FIG. 7, in an LED columnar light emitting device 14 which is variation of Embodiment 4 having two conductive regions 2A and 3A with concave-convex shapes in a plan view for preventing a device from folding, a cutout section 9B, as opening sections, is formed in a polyimide film between the two plated lines 4.

(Embodiment 5)

The above-described Embodiments 1-4 explain a case of cutting the side with longer sides of the two conductive regions 2 and 3 for every predetermined number of LED light emitting devices. However, Embodiment 5 explains a case in which the side with shorter sides of the two conductive regions 2 and 3 are rolled up in a roll in the columnar direction.

FIG. 8 is a plan view showing an example configuration of essential parts of an LED columnar light emitting device in Embodiment 5 of the present invention. In FIG. 8, constituent members achieving the same working effect as the constituent members of FIG. 1 are explained while being assigned with the same reference numeral. In FIG. 8, the top side is (+) and the bottom side is (−) in a plan view.

In FIG. 8, a plurality of two conductive regions 2B and 3B, corresponding to the ± polarities, are disposed on a film wiring board in the columnar direction in an LED columnar light emitting device 15 of Embodiment 5. Between the two conductive regions 2B and 3B in the columnar direction and the two conductive regions 2B and 3B adjacent thereto on the top and bottom (columnar direction), two plated lines 4 are connected only in the columnar direction and hold the numerous two conductive regions 2B and 3B in the columnar direction.

The difference between the two conductive regions 2 and 3 of Embodiments 1-3 described above and the two conductive regions 2B and 3B of Embodiment 5 is that the side with longer sides of the two conductive regions 2 and 3 is disposed in the columnar direction for the two conductive regions 2 and 3 of Embodiments 1-3 described above, whereas the side with shorter sides of the two conductive regions 2B and 3B of Embodiment 5 is disposed in the columnar direction. The disposed directions thereof are different by a 90 degree angle with respect to each other. When the side of the short sides of the two conductive regions 2B and 3B of Embodiment 5 is disposed in the columnar direction, the number of the two conductive regions 2B and 3B (number of light emitting devices) per unit length is greater. LED columnar light emitting device is rolled up and housed in a roll shape.

An LED chip 6 is bonded by die bonding on each of the conductive regions 2B on a film wiring board. Furthermore, both electrode terminals of each LED chip 6 and the two conductive regions 2B and 3B, corresponding to the ± polarities, are each bonded by wire bonding with gold wire 7. When the plated line 4 on the side of the plurality (herein three) of the conductive regions 2B in the columnar direction is applied with a positive voltage and the plated line 4 on the side of the plurality (herein three) of conductive regions 3B (farther side) in the columnar direction is applied with a negative voltage, the plurality (herein three in series) of LED columnar light emitting devices 15 in the columnar direction would emit light. In this regard, numerous LED light emitting devices are provided in the columnar direction and rolled up in a roll shape. An auxiliary land 5 for applying a voltage with a greater area than the plated lines 4 in the columnar direction may be disposed part way through for each predetermined length.

The plurality of LED chips 6 are sealed above by a transparent sealing resin 8 such as a silicon resin, in which a predetermined amount of phosphor is mixed at a predetermined ratio, on a film wiring board where each LED chip 6 is installed. A region of the transparent sealing resin 8 has a circular shape in a plan view.

In the LED columnar light emitting device 15, notch sections 9 and 9A, as opening sections, are formed on both sides in the width direction between the two conductive regions 2B and 3B and the LED chip 6 thereon and the two conductive regions 2B and 3B adjacent thereto in the columnar direction and an LED chip 6 thereon. The notch sections 9 and 9A are formed on both outer sides of the two plated lines 4. The space between the two conductive regions 2B and 3B and the two conductive regions 2B and 3B adjacent thereto in the columnar direction and between regions of adjacent transparent sealing resins 8, is comprised of a polyimide film of a film wiring base material. In addition, the polyimide film of the film wiring base material can be readily molded. Thus, the notch sections 9 and 9A are formed in the polyimide film of the film wiring base material together by pressing with a mold. The notch sections 9 and 9A are optimally formed after forming a sealing resin. The notch sections 9 and 9A are formed on the outside of the two conductive regions 2B and 3B and outside of the sealing resin 8.

Since the notch sections 9 and 9A are disposed on both outer sides of the two plated lines 4 between the two conductive regions 2B and 3B and the two conductive regions 2B and 3B adjacent thereto in the columnar direction in the LED columnar light emitting device 15 of Embodiment 5 having the side of short sides of conductive regions in the columnar direction, the LED columnar light emitting device 15 of Embodiment 5, when bent, can be primarily bent at the notch sections 9 and 9A. Thus, there is no breakage of the plated line 4, peeling off of the transparent sealing resin 8 or breakage of the gold wire 7 as in conventional techniques and it is possible to bend the LED columnar light emitting device 15 readily and safely.

Embodiment 5 explains a case of forming the notch sections 9 and 9A, as opening sections, in a polyimide film on both outer sides of the two plated lines 4, by pressing using a mold, in the LED columnar light emitting device 15 of Embodiment 5, where the side of the short sides of two conductive regions is the columnar direction. However, the present invention is not limited thereto. A cutout section 9B, as an opening section, may be formed in the polyimide film between the two plated lines 4.

FIG. 9 is a plan view showing another example configuration of essential parts of the LED columnar light emitting device in Embodiment 5 of the present invention. In FIG. 9, constituent members achieving the same working effect as the constituent members of FIG. 9 are assigned with the same reference numeral and the explanation thereof is omitted. In FIG. 9, the top side is (+) and the bottom side is (−) in a plan view.

As shown in FIG. 9, the cutout section 9B, as an opening section, is formed in a polyimide film between the two plated lines 4 in an LED columnar light emitting device 16 in a variant of Embodiment 5 having the two conductive regions 2B and 3B with the side of short sides of the two conductive regions in the columnar direction.

Embodiment 5 explains a case in which the side of short sides of the two conductive regions 2B and 3B is in the columnar direction and the plurality (herein three) of LED chips 6 are connected in series in the columnar direction, while sides of the two conductive regions 2B and 3B opposing each other are parallel in a plan view. However, the present invention is not limited thereto. The present invention can also be applied to a case in which the side of the short sides of two conductive regions (not shown) is in the columnar direction and the plurality (herein three) of LED chips 6 are connected in series in the columnar direction, while sides of the two conductive regions opposing each other have concave-convex shapes that fit each other in a plan view. Thereby, a device is prevented from folding in a transverse direction and an LED columnar light emitting device is bent readily and safely.

In the above-described Embodiments 1-5, the notch sections 9 and 9A or the cutout section 9B has one or more rectangular shapes. However, the present invention is not limited thereto. The plan view shape of the notches 9 and 9A or the cutout section 9B may be one or more partial or complete squares, partial or complete rectangles, partial or complete circles, partial or complete ellipses or partial or complete obround shapes. In other words, for example, it may be arranged as a plurality of small circles.

A column of columnar light emitting devices is used herein, but a light emitting device with a plurality of columns (2 or more columns) may be used. In this case, a notch section is formed on at least one of two sides of the plated line 4. The cutout section is formed in at least one of the spaces between the plated lines 4.

Specifically, the plurality of two conductive regions 2 and 3 are connected by the plurality of plated lines 4 in the columnar direction which are required upon plating the plurality of two conductive regions 2 and 3. The plurality of two conductive regions 2 and 3 and each of the light emitting elements 6 that are connected to and installed in the plurality of two conductive regions 2 and 3 are disposed in a plurality of columns (two or more columns). In addition, notch sections formed on both outer sides of the plurality of the plated lines 4 and/or a cutout section formed on at least one of the spaces between the plurality of plated lines 4 are formed.

The notch sections 9 and 9A and/or the cutout section 9B is at least one or more partial or complete squares, one or more partial or complete rectangles, one or more partial or complete circles, one or more partial or complete ellipses or one or more partial or complete obround shapes. Specifically, the notch sections 9 and 9A are at least one of a partial square, partial rectangle, partial circle, partial ellipse or partial obround shape. In addition, the cutout section 9B is at least one or more complete squares, one or more complete rectangles, one or more complete circles, one or more complete ellipses, or one or more complete obround shapes.

As described above, the present invention is exemplified by the use of its preferred Embodiments 1 to 5 of the present invention. However, the present invention should not be interpreted solely based on Embodiments 1 to 5. It is understood that the scope of the present invention should be interpreted solely based on the scope of the claims. It is also understood that those skilled in the art can implement equivalent scope of technology, based on the description of the present invention and common knowledge from the description of the detailed preferred Embodiments 1 to 5 of the present invention. Furthermore, it is understood that any patent, any patent application and any references cited in the present specification should be incorporated by reference in the present specification in the same manner as the contents that are specifically described therein.

INDUSTRIAL APPLICABILITY

The present invention can be applied in the field of a columnar light emitting device, such as an LED light emitting device or a laser light emitting device, a plurality of which is arranged in a columnar direction and used in an LED module, an LED package or the like, and a method of manufacturing the same. In accordance with the present invention, the device can be readily bent without any problems such as breakage in a plated line, peeling off of a sealing resin or breakage of a wire, because an opening section is formed between two conductive regions and the two conductive regions adjacent thereto in the columnar direction.

The invention claimed is:

1. A columnar light emitting device comprising:
a wiring board,
a plurality of two conductive regions corresponding to ±polarities provided on the wiring board in a columnar direction in one or more columns,
a light emitting element connected to each of the plurality of two conductive regions,
a sealing resin for sealing each light emitting element,
an opening section formed between the two conductive regions and the two conductive regions adjacent thereto in the columnar direction,
a linear power supply line provided in the columnar direction between the two conductive regions that are adjacent to each other,
wherein each of the plurality of two conductive regions is connected by the linear power supply line, and
wherein a width of the linear power supply line is formed to be narrower than each width of the two conductive regions,
wherein the opening section comprises a notch section and/or a cutout section, and
wherein the notch section and/or the cutout section is fabricated in a resin film of a film wiring base material on the wiring board.

2. A columnar light emitting device comprising:
a wiring board,
a plurality of two conductive regions corresponding to ±polarities provided on the wiring board in a columnar direction in one or more columns,
a light emitting element connected to each of the plurality of two conductive regions,
a sealing resin for sealing each light emitting element,
an opening section formed between the two conductive regions and the two conductive regions adjacent thereto in the columnar direction,
a linear power supply line provided in the columnar direction between the two conductive regions that are adjacent to each other,
wherein each of the plurality of two conductive regions is connected by the linear power supply line, and
wherein a width of the linear power supply line is formed to be narrower than each width of the two conductive regions
wherein the opening section comprises a notch section and/or a cutout section, and
wherein the notch section and/or the cutout section is formed in a resin film between adjacent sealing resin regions in the columnar direction.

* * * * *